(12) United States Patent  (10) Patent No.: US 9,094,016 B2
Tokudome  (45) Date of Patent: Jul. 28, 2015

(54) TOUCH SENSOR

(75) Inventor: Tetsuo Tokudome, Hiroshima (JP)

(73) Assignee: U-SHIN LTD., Tokyo (JP)

( * ) Notice: Subject to any disclaimer, the term of this patent is extended or adjusted under 35 U.S.C. 154(b) by 532 days.

(21) Appl. No.: 13/110,354

(22) Filed: May 18, 2011

(65) Prior Publication Data

US 2011/0298482 A1 Dec. 8, 2011

(30) Foreign Application Priority Data

Jun. 4, 2010 (JP) ................................. 2010-129029

(51) Int. Cl.
G01R 27/26 (2006.01)
H03K 17/96 (2006.01)

(52) U.S. Cl.
CPC .. *H03K 17/962* (2013.01); *H03K 2217/960705* (2013.01)

(58) Field of Classification Search
CPC ....................................................... G01R 27/26
USPC ......... 324/686, 658, 661, 663, 662, 667, 674, 324/656; 345/174, 173; 178/18.06; 340/5.2, 340/545.3
See application file for complete search history.

(56) References Cited

U.S. PATENT DOCUMENTS

| | | | | |
|---|---|---|---|---|
| 6,906,695 B1 * | 6/2005 | Ishida et al. | .................. | 345/156 |
| 7,218,224 B2 * | 5/2007 | Tokudome | .................... | 340/561 |
| 2002/0030594 A1 * | 3/2002 | Inaba et al. | .................... | 340/562 |
| 2003/0078696 A1 * | 4/2003 | Sakamoto et al. | ............ | 700/245 |
| 2004/0201370 A1 * | 10/2004 | Clauss et al. | ..................... | 324/67 |
| 2004/0207476 A1 * | 10/2004 | Itaya | .......................... | 331/177 V |
| 2007/0146209 A1 * | 6/2007 | Touge et al. | ................... | 343/702 |
| 2007/0171209 A1 * | 7/2007 | Lin et al. | ........................ | 345/173 |
| 2007/0194878 A1 * | 8/2007 | Touge et al. | ................... | 340/5.2 |
| 2008/0093130 A1 * | 4/2008 | Lee et al. | ..................... | 178/18.01 |
| 2008/0119994 A1 * | 5/2008 | Kameyama | ..................... | 701/48 |
| 2009/0065267 A1 * | 3/2009 | Sato | ........................... | 178/18.06 |
| 2009/0128240 A1 * | 5/2009 | Miyagi | .......................... | 331/16 |
| 2010/0259503 A1 * | 10/2010 | Yanase et al. | .................. | 345/174 |
| 2010/0295804 A1 * | 11/2010 | Takeuchi et al. | ............... | 345/173 |

FOREIGN PATENT DOCUMENTS

JP 11-088139 3/1999
JP 2007-150733 6/2007

* cited by examiner

*Primary Examiner* — Patrick Assouad
*Assistant Examiner* — Lamarr Brown
(74) *Attorney, Agent, or Firm* — Wenderoth, Lind & Ponack, L.L.P.

(57) ABSTRACT

Provided is a touch sensor stable against environmental variation comprising an oscillator which outputs a periodical operation signal, an antenna electrode which has a electrostatic capacitance straining the operation signal to form an output signal, a detection circuit which generate a detection value corresponding to a difference between the output signal and a predetermined reference voltage, a determination means which determines whether a human body is proximate to the antenna electrode, based on the detection value, wherein a frequency of the operation signal is varied so that the detection value gets closer to a predetermined standard value.

4 Claims, 6 Drawing Sheets

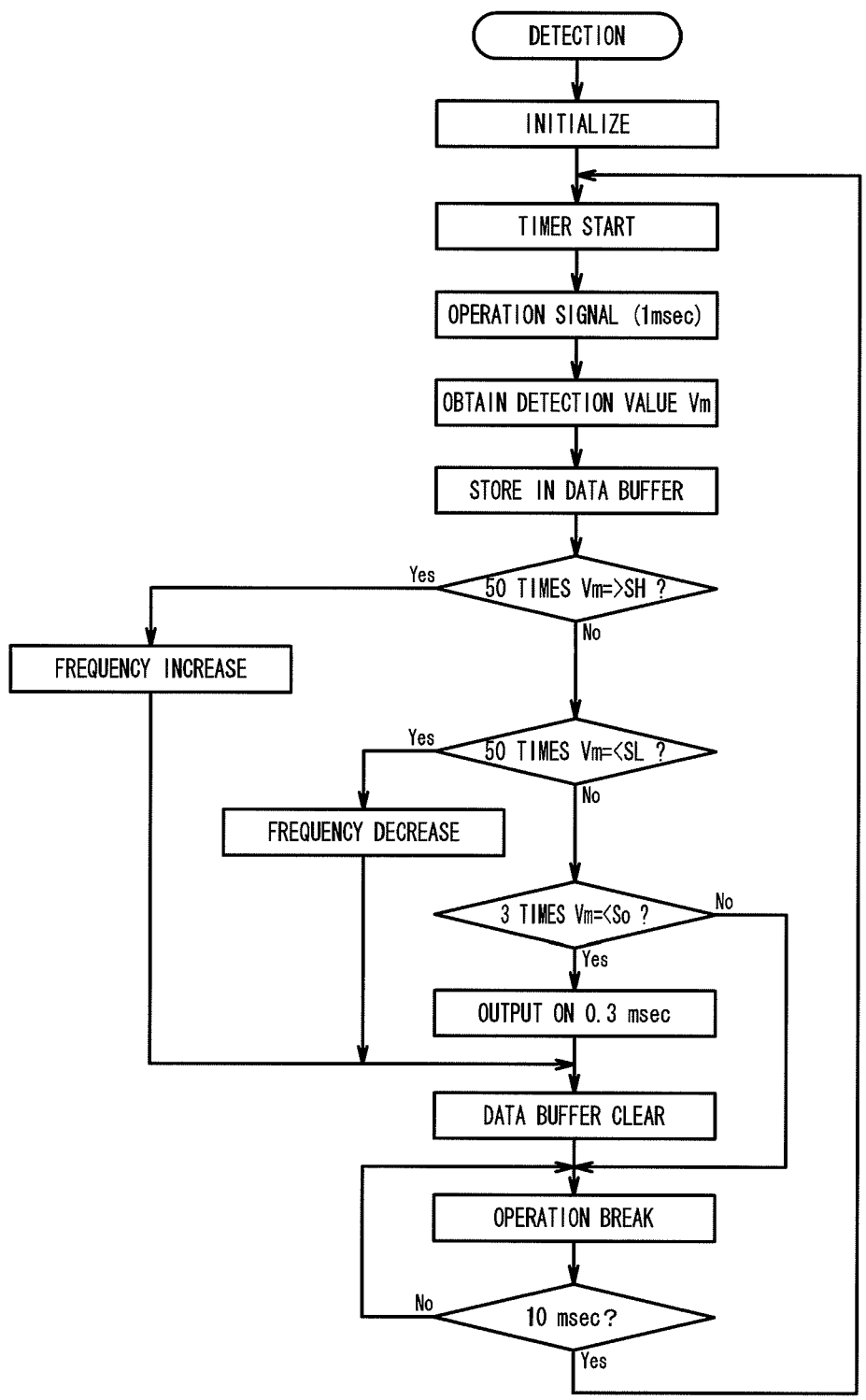

TOUCH SENSOR

BACKGROUND OF THE INVENTION

The present invention relates to a touch sensor detecting that a human is touching or proximate to an electrode.

DESCRIPTION OF THE RELATED ART

As described in JP 2007-150733 A, for example, it is used a touch sensor detecting a variation in an electrostatic capacitance of an electrode caused by touching or approximating to a human body. In such sensor, a variation in the electrostatic capacitance of the electrode can be caused not only by an approximation of a human body, but also by an environmental variation such as variation in a temperature and humidity. Therefore, conventional sensor, even without a human body being proximate, can output a detection signal due to variation in temperature or humidity.

Such false detection will be prevented, if the touch sensor is designed so that a variation of an electrostatic capacitance of the electrode depending on a temperature or a humidity is smaller, in comparison with a variation of the electrostatic capacitance due to an approximation of a human body. However, in that case, it remains a problem that detection sensitivity to an approximation of a human body is varied significantly due to variation in the electrostatic capacitance depending on a temperature and humidity.

In view of the above problem, the object of the present invention is to provide a touch sensor stable against an environmental variation.

SUMMARY OF THE INVENTION

In order to achieve the above object of the present invention, there is provided a touch sensor comprising an oscillator which outputs a periodical operation signal, an antenna electrode which has a electrostatic capacitance straining the operation signal to form an output signal, a detection circuit which generate a detection value corresponding to a difference between the output signal and a predetermined reference voltage, a determination means which determines whether a human body is proximate to the antenna electrode, based on the detection value, an adjustment means which changes a frequency of the operation signal so that the detection value gets closer to a predetermined standard value.

In accordance with this construction, the detection value is maintained at a value close to the standard value by changing the frequency of the operation signal. Therefore, the touch sensor can detect only a variation of the electrostatic capacitance of the electrode caused by an approximation of a human body. Accordingly, even if the temperature or the humidity is varied, the detection sensitivity to an approximation of a human body is not varied greatly. Consequently, any fails detection is not arisen, even if the touch sensor is setup at high detection sensitivity.

Further, in the touch sensor according to the present invention, the determination means may determine that a human body is proximate to the antenna electrode, when a magnitude relation between the detection value and a predetermined proximate threshold value has continuously inverted for longer than a predetermined determination duration.

In accordance with this construction, the touch sensor filters temporal variations of the detection value due to a noise and the like so as to maintain the operation signal at an appropriate frequency. Therefore, the touch sensor can accurately detect only an approximation of a human body.

Further, in the touch sensor according to the present invention, the adjustment means may change the frequency of the operation signal so that the detection value gets closer to the predetermined standard value, when a magnitude relation between the detection value and a predetermined change threshold value has continuously inverted for longer than a predetermined change duration, and the change duration is longer than the determination duration.

Since an environmental variation takes longer time compared to approximating and stepping away of a human body, by setting the change duration longer than the determination duration, a variation due to an approximation of a human body will not affect the adjustment of the frequency of the operation signal.

Further, in the touch sensor according to the present invention, the change threshold value is preferably closer to the standard value than the proximate threshold value.

If the change threshold value is closer to the standard value than the proximate threshold value, a variation caused by an environmental variation can be compensated before faultily detected as an approximation of a human body.

Further, in the touch sensor according to the present invention, the detection circuit may include a comparator outputting ON or OFF output depending on a magnitude relation between the output signal of the antenna electrode and the reference voltage, and an integration circuit integrating the output of the comparator.

In accordance with this construction, the touch sensor can detect variations in the electrostatic capacitance of the electrode caused by an approximation of a human body and by an environmental variation, and compensate the variation by an environmental variation, with a simple circuit configuration.

BRIEF DESCRIPTION OF THE DRAWINGS

FIG. 6 is a flowchart of a process of a touch sensor as second embodiment of the present invention.

DETAILED DESCRIPTION OF THE PREFERRED EMBODIMENT

Figure 1:
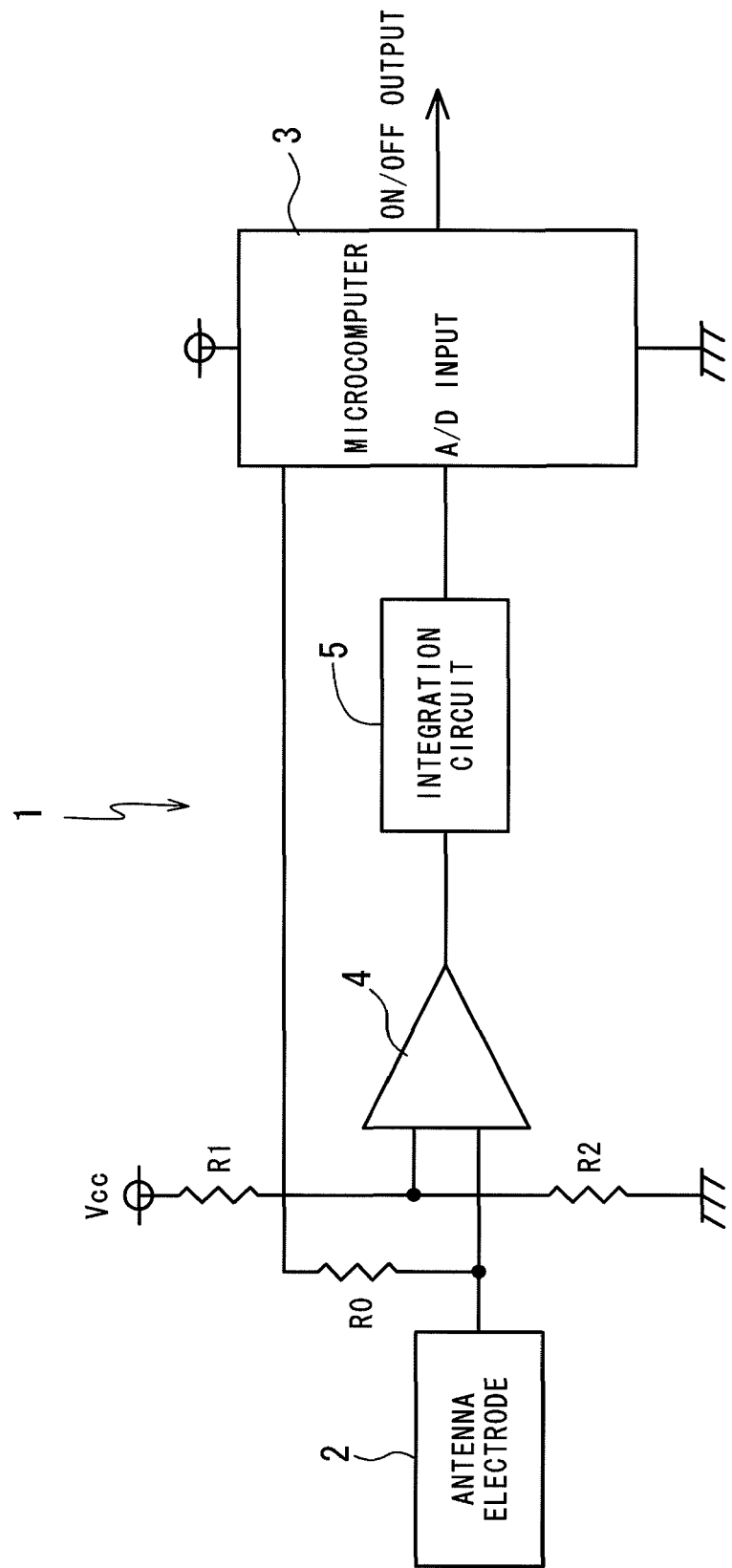
FIG. 1 is a circuit diagram of a touch sensor as first embodiment of the present invention.

The embodiments of the present invention will now be described with reference to the drawings. FIG. 1 is a circuit diagram of a touch sensor 1 being first embodiment of the present invention.

The touch sensor 1 has an antenna electrode 2, an electrostatic capacitance of which is varied due to an approximation of a human body, a microcomputer (a determination means) 3 functioning as an oscillator which outputs an operation signal consisting of a periodical rectangular wave to input to the antenna electrode 2 through a resistance R0, two resistances R1, R2 connected in series so as to divert a direct current source voltage Vcc (V), a comparator 4 which compares an output voltage of the antenna electrode 2 and a potential between the resistance R1 and the resistance R2 (reference voltage Va), and which outputs a predetermined voltage when the output voltage of the antenna electrode 2 is higher, and turns off not to output a voltage when the output voltage of the antenna electrode 2 is lower, and a integration circuit 5 which integrates the output of the comparator 4.

The output of the integration circuit is inputted to the microcomputer 3, and is transformed into a digital to be processed in an arithmetic calculation. The microcomputer 3 is programmed so as to serve as an adjustment means which changes a frequency of the operation signal based on a calculation result.

Figure 2:
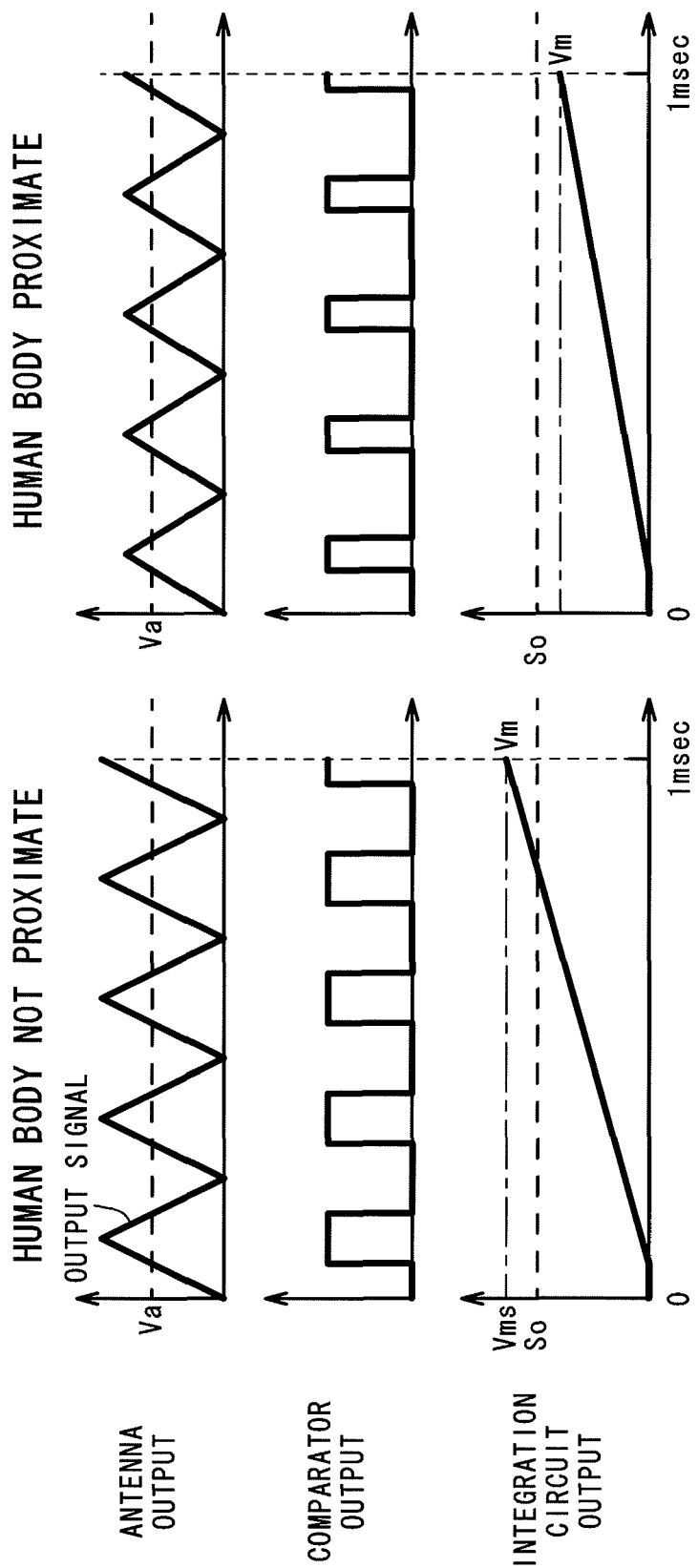
FIG. 2 is a chart showing a variation in outputs caused by an approximation of a human body.

FIG. 2 shows variations in the output voltage of the antenna electrode 2, in the output voltage of the comparator 4 and in the output voltage of the integration circuit 5, separately in a case that a human body is not proximate to the antenna electrode 2 (left) and in a case that a human body is proximate to the antenna electrode 2 (right).

The antenna electrode 2 strains the operation signal voltage by its electrostatic capacitance. Therefore, the output signal is a voltage signal with a waveform that is as a strained waveform of the rectangular wave inputted from the microcomputer 3 and that is close to a saw teeth wave delayed in rise and decay (for the sake of simplification, shown as a complete triangular wave).

The comparator 4 outputs a voltage, only when the output (output signal) of the antenna electrode 2 is higher than the potential between the resistance R1 and the resistance R2 (reference voltage Va). Since the integration circuit 5 integrates the output of the comparator 4, the output of the integration circuit 5 generally rises linearly, an inclination of which is in proportion to a duty ratio (a rate of turning on duration) of the output of the comparator 4.

The microcomputer 3 transforms an output voltage of the integration circuit 5 at 1 msec after the integration circuit 5 starts the integration, and stores the transformed voltage as a detection value Vm. It is noted that the detection value Vm is stored in a storing means such as an unshown memory embedded in the microcomputer 3.

In this embodiment, the comparator 4, the integration circuit 5 and the microcomputer 3 together serve as a detection circuit which forms a detection value Vm according to a difference between the output signal of the antenna electrode 2 and the reference voltage Va.

When a human body is proximate, the electrostatic capacitance of the antenna electrode 2 is increased. Therefore, as shown in the right chart in FIG. 2, an amplitude of the output signal of the antenna electrode 2 is decreased in comparison with that when a human body is not proximate (left chart in FIG. 2). Thus, the duration that the output signal of the antenna electrode 2 is higher than the reference voltage Va gets shorter to reduce the duty ratio of the output voltage of the comparator 4 so as to decrease the inclination of the output voltage rise of the integration circuit 5. Accordingly, the voltage after 1 msec gets lower, and thereby the detection value Vm obtained by the microcomputer 3 gets smaller.

The microcomputer 3 compares this detection value Vm with a predetermined proximate threshold value So (shown by a broken line) which is stored in the storing means in the microcomputer 3. When the detection value Vm is equal to or smaller than the proximate threshold value So, the microcomputer 3 determines that a human body is proximate to the antenna electrode 2, and externally outputs an ON output (a determination means).

Figure 3:
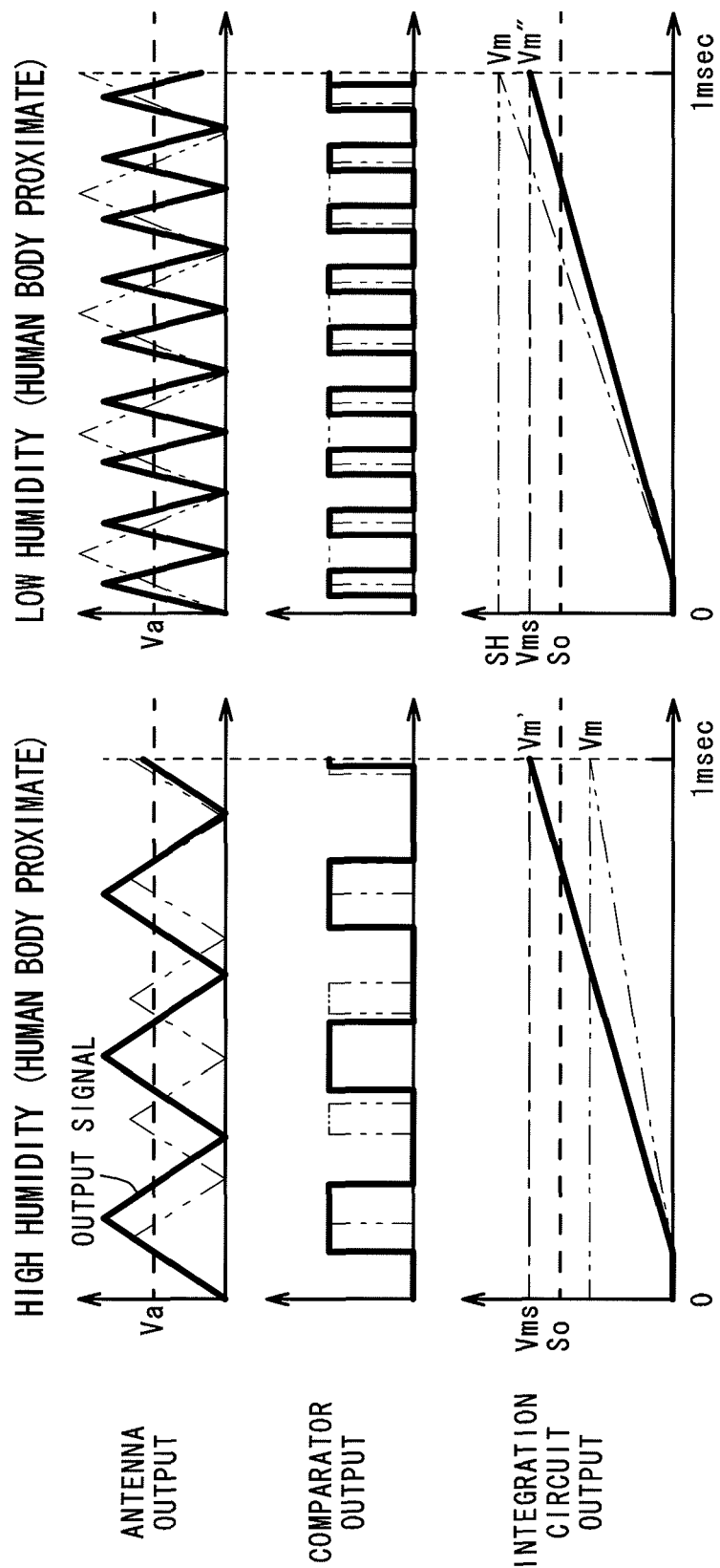
FIG. 3 is a chart showing a variation in outputs caused by an environmental variation.

In this operation, it should be considered that the electrostatic capacitance of the antenna electrode 2 is varied not only by approximation of a human body, but also by a humidity variation. Specifically, the electrostatic capacitance of the antenna electrode 2 is increased at a high humidity. Therefore, at a high humidity, as shown in left side of FIG. 3 by a two dot chain line, the amplitude of the output signal of the antenna electrode 2 is decreased, even if a human body is not proximate to the antenna electrode 2. Then, the duty ratio of the output voltage of the comparator 4 is decreased to reduce the inclination of output of the integration circuit, and therefore the detection value Vm obtained by the microcomputer 3 is decreased.

As described above, the detection value Vm is decreased due to an environmental variation. Therefore, the touch sensor 1 can determine that a human body is proximate, although no human body is proximate, and thereby outputs the ON output continuously from the microcomputer 3. That means the touch sensor 1 possibly looses an ability to detect an approximation of a body at a high humidity.

Therefore, the touch sensor 1 discriminates such decreasing of the detection value Vm due to a high humidity, by comparing with the proximate threshold value So (a change threshold value). If the detection value Vm is equal to or less than the proximate threshold value So, as shown by a continuous line in the chart, by reducing the frequency of the operation signal outputted from the microcomputer 3, the amplitude of the output signal is increased. This is caused because an impedance of the antenna electrode 2 showing a capacitive characteristic is increased with a lowered frequency and thereby a dividing ratio between the resistance R0 and the impedance of the antenna electrode 2 is changed to increase the voltage of the out put signal.

Therefore, as shown by a continuous line in the chart, the duty ratio of the output voltage of the comparator 4 is increased to increase the inclination of the output of the integration circuit 5, and thereby the detection value Vm' obtained by the microcomputer 3 is also increased. In this way, touch sensor 1 maintains the detection value Vm' with no human body proximate at a vale close to a detection value obtained in an environment with a normal temperature and humidity with no human body proximate (standard value Vms). As described above, in a case that the detection value Vm is decreased due to an environmental variation so that the detection value Vm is equal to or smaller than the proximate threshold value So, by changing the frequency of the operation signal, the detection value Vm can be raised over the proximate threshold value So. Thus, the touch sensor 1 can again be able to detect an approximation of a human body so as to detect the variation in the electrostatic capacitance of the antenna electrode 2 caused by an approximation of a human body at an accuracy and a sensitivity not different from in a normal environment. It is noted that the standard value Vms can be set at any value higher than the proximate threshold value So, and therefore may be set depending on an environment in which the touch sensor 1 is used, a required sensitivity and the like. Further, the changing amount of the detection value Vm can be adjusted by arbitrarily adjusting the changing amount of the frequency of the operation signal.

Also, in a low humidity, the electrostatic capacitance of the antenna electrode 2 is decreased from that in a normal humidity. Therefore, as shown by a two dot chain line in right of FIG. 3, when the electrostatic capacitance of the antenna electrode 2 is decreased without a human body proximate, the amplitude of the output signal of the antenna electrode 2 is increased. Then, the duty ratio of the output voltage of the comparator 4 is increased so as to increase the inclination of the output of the integration circuit 5, and therefore the detection value Vm obtained by the microcomputer 3 is increased. In this way, in a case that the detection value Vm is increased due to an environmental variation so that the difference between the detection value Vm and the proximate threshold value is increased, the sensitivity to an approximation of a human body is reduced.

Therefore, in the touch sensor 1, an upper limit change threshold value SH is set as an upper limit value for the detection value Vm. When the detection value Vm is equal to or larger than the upper limit change threshold value SH, the frequency of the operation signal outputted from the microcomputer 3 is increased by a predetermined frequency, and thereby the impedance of the antenna electrode 2 is reduced so as to decrease the amplitude of the output signal as shown by a continuous line in the chart. It is noted that the upper limit change threshold value SH is preliminary set and stored in the storing means in the microcomputer 3. Since, as shown by a continuous line, the duty ratio of the output voltage of the comparator 4 is decreased so that the inclination of the output of the integration circuit 5 is reduced and therefore a detection value Vm" obtained by the microcomputer 3 is reduced.

Accordingly, the touch sensor 1, even in an environment with a low humidity, maintains the detection value without a human body proximate at a value close to a detection value in the environment with a normal temperature and humidity (standard value Vms). In this way, in a case that the detection value Vm is increased due to an environmental variation so that the difference between the detection value Vm and the proximate threshold value So gets large, by changing the frequency of the operation signal as described above, the detection value Vm can get closer to the standard value Vms. As a result, a variation in the electrostatic capacitance of the antenna electrode 2 caused by an approximation of a human body to the antenna electrode 2 can be detected with an accuracy and a sensitivity not so different from that in a normal environment.

Figure 4:
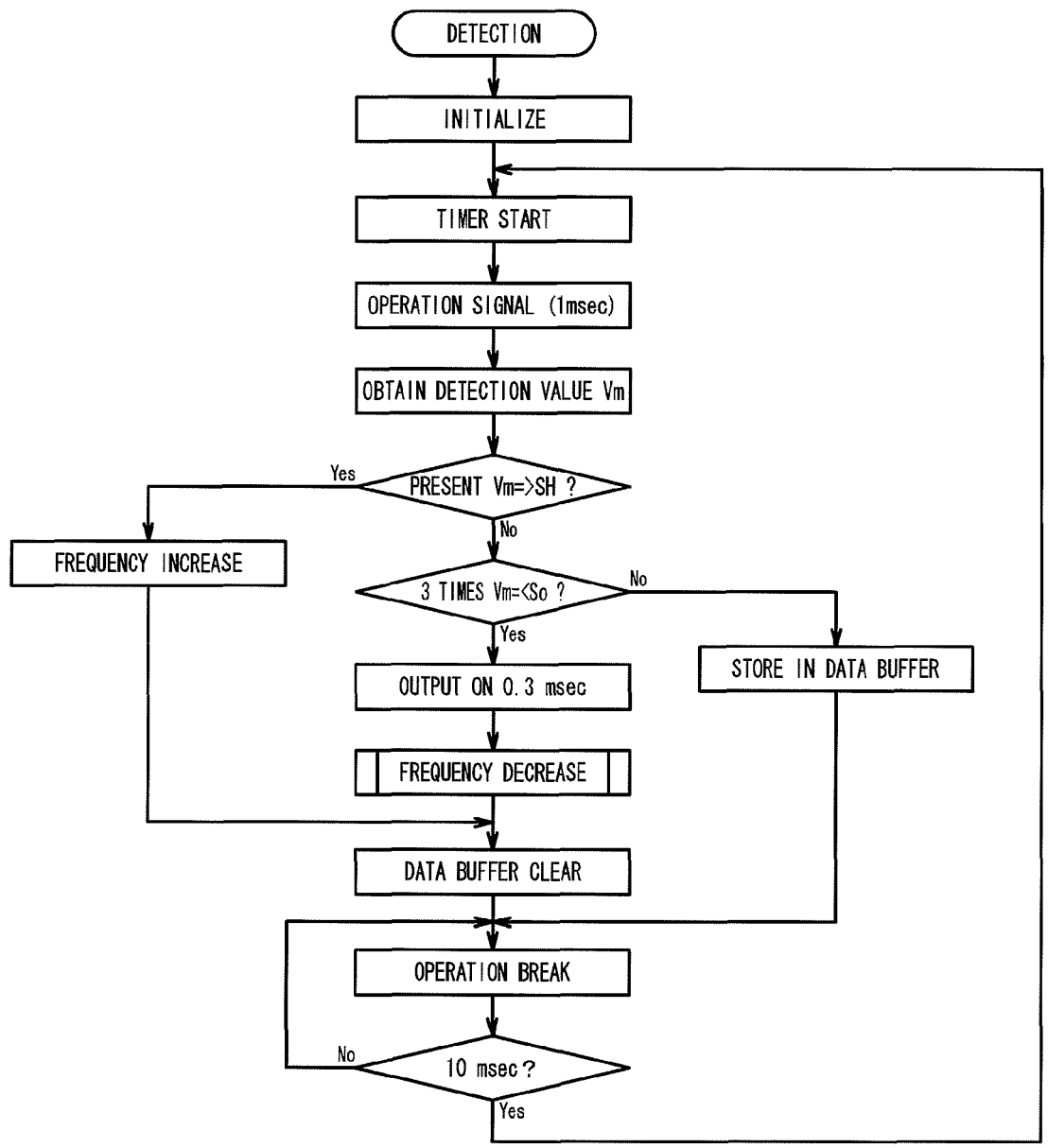
FIG. 4 is a flowchart of a control related to a detection of an approximation of a human body.
Figure 5:
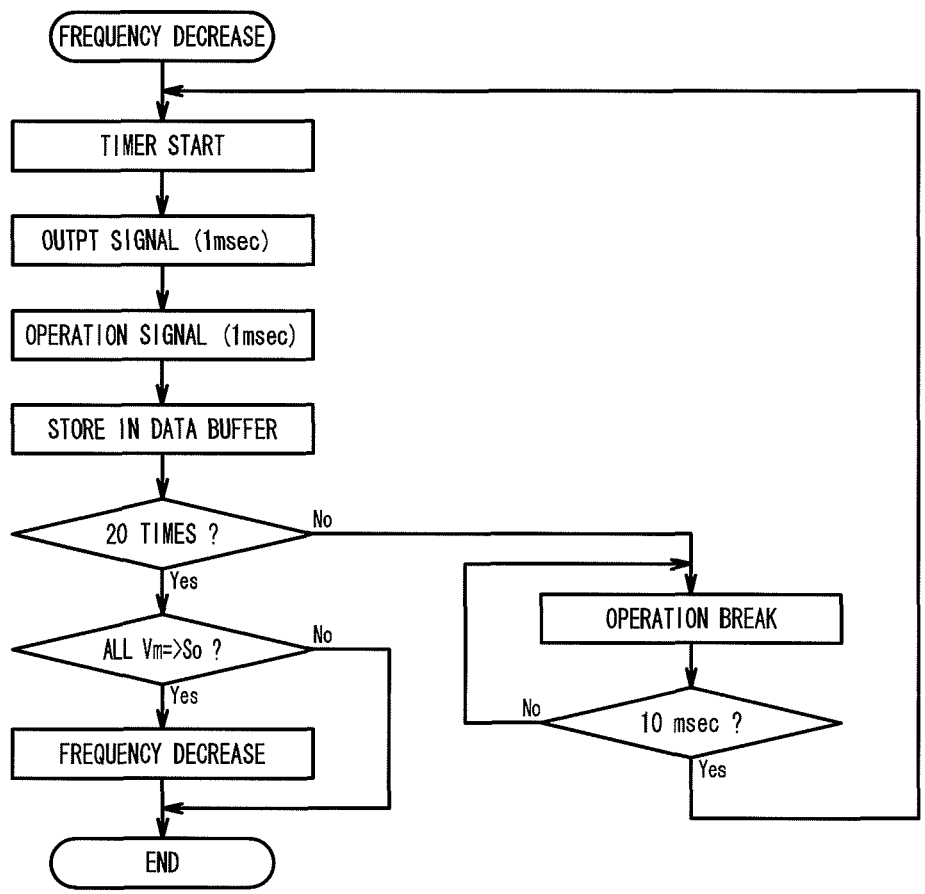
FIG. 5 is a flowchart of a control related to a frequency changing process.

FIGS. 4 and 5 shows flows of controls in regard to the detection of an approximation of a human body and the change of the frequency of the operation signal in the microcomputer 3 of the touch sensor 1. The touch sensor 1 starts this control when a power source is applied. Then the microcomputer 3 clears a data buffer (memory) and a timer, at first.

The touch sensor 1 starts a timer once every 10 msec to check an approximation of a human body to the antenna electrode 2. Then, the microcomputer 3 inputs a operation signal consisting of a rectangular wave into the antenna electrode 2 for 1 msec to obtain a detection value Vm which is transformed from an output voltage of the integration circuit at 5 1 msec after start.

The microcomputer 3 compares this detection value Vm with a predetermined upper limit change threshold value SH higher than the detection value obtained in an environment with a normal temperature and humidity (standard value). If the detection value Vm is equal to or larger than the upper limit change threshold value SH, the microcomputer 3 increases the frequency of the operation signal so as to the detection value Vm get closer to the standard value.

Since the detection value Vm is decreased when a human body is proximate, if the detection value Vm is equal to or larger than the upper limit change threshold value SH, no human body is proximate to the antenna electrode 2. Therefore, after increasing the frequency of the operation signal, the microcomputer 3 clears the data buffer and waits for 10 msec passing.

If the detection value Vm is less than the upper limit change threshold value SH, the microcomputer 3 reads out previous two detection values Vm from the data buffer, and compares the latest three detection values Vm respectively with the proximate threshold value So for determination of an approximation of a human body to the antenna electrode 2. This proximate threshold value So is a value lower than the detection value obtained in an environment with a normal temperature and humidity (standard value).

If any one of the latest three detection value Vm is larger than the proximate threshold value So, it is assumed as a resultant of a noise or the like. Therefore, the microcomputer 3 determines that no human body is proximate, stores the detection value Vm at this time in the data buffer, and waits until next detection.

If the detection values are equal to or less than the proximate threshold value So three times in a row, that means if the detection value Vm has continuously been equal to or less than the proximate threshold value So for longer than 30 msec (predetermined determination duration), the microcomputer 3 determines that a human body is proximate to the antenna electrode 2, and externally outputs an ON output for 0.3 msec. After determining the approximation of a human body and outputting ON output, the touch sensor further perform the determination whether the frequency of the operation signal need to be decreased or not, as shown in FIG. 5 (frequency decreasing process).

Similarly, in the frequency decreasing process, the microcomputer 3 applies the operation signal for 1 msec to the antenna electrode 2, and digitalizes the output voltage of the integration circuit 5 to obtain the detection value Vm. In this process, the 20 detection values Vm are repeatedly obtained, and the all detection values Vm are stored in the data buffer.

Then, if all of the detection values Vm obtained in this process are equal to or less than the proximate threshold value So, it can be estimated that the detection value Vm is continuously kept at a lower value for 0.5 msec including the time of outputting the ON output (predetermined change duration). Such long period of decreasing of the detection value Vm can be considered to be caused by an environment such as a low temperature and a high humidity, and not by approximation of a human body.

Therefore, when the all detection value Vm are equal to or less than the proximate threshold value So, the microcomputer 3 decreases the outputting operation signal by the predetermined frequency so that the detection value Vm is increased to get closer to the standard value. However, any one or more larger detection value Vm than the proximate threshold value So are existing, it is highly possible to be caused by an approximation of a human body, and therefore it is determined that a change in the frequency of the operation signal is not required.

If this frequency decreasing process is completed, the microcomputer 3 goes back to the process in FIG. 4. Then, the microcomputer 3 clears the data buffer and waits for next detection.

As described above, in the touch sensor 1, a variance of the detection value Vm due to environmental variation is cancelled by adjustment of the frequency of the operation signal, and therefore the sensitivity to an approximation of a human body is not varied seriously so that a accuracy of the detection of a human body approximation is maintained at a high degree.

Further, since the touch sensor 1 is configured so as to determined that a human body is proximate to the antenna electrode 2 when the detection value Vm is equal to or smaller than the proximate threshold value So continuously for longer than the predetermined determination duration, only an approximation of a human body can be accurately detected with filtering a temporal variation of the detection value Vm due to a noise and the like.

Moreover, since a environmental variation takes a long time, according to the duration in which the variation of the detection value Vm is kept, it can be determined whether the variation of the detection value Vm is caused by an approximation of a human body or by an environmental variation. Therefore, by setting the change duration for determining whether the frequency of the operation signal should be changed or not at a value longer than the determination duration for determining whether a human is proximate or not, it is ensured that the frequency of the operation signal is not unexpectedly changed due to a variation of the detection value caused by an approximation of a human body.

Additionally, FIG. 6 shows a flow of controls in regard to the detection of an approximation of a human body and the change of the frequency of the operation signal in a touch sensor as the second embodiment of the present invention. Since the mechanical construction of the touch sensor of this embodiment is same as the first embodiment, repeated descriptions will be omitted.

Also in this embodiment, the touch sensor, similar to the first embodiment, applies an output signal every 10 msec to the antenna electrode to obtain detection values Vm. In this embodiment, the microcomputer 3 stores all of the obtained detection values Vm into the data buffer.

Different from the first embodiment, in this embodiment, even if the detection value Vm gets larger only once than the upper limit change threshold value SH, the frequency of the operation signal is not changed. Specifically, this embodiment reads out the latest 50 detection values Vm from the data buffer to compare with the upper limit change threshold value SH. If the all of the latest 50 detection values Vm are larger than the upper limit change threshold value SH, the frequency of the operation signal is increased.

Further, in this embodiment, the latest 50 detection values Vm are compared with a lower limit change threshold value SL (stored in the storing means of the microcomputer 3) which is larger than the proximate threshold value So and which is preset at a smaller value than the upper limit change threshold value SH. If the all of latest 50 detection values Vm (for 0.5 msec) are smaller than the lower limit change threshold value SL, the frequency of the operation signal is decreased so that the detection value Vm gets closer to the standard value.

In regard to the detection of an approximation of a human body to the antenna electrode, in similar way, if all of the latest three detection values Vm are smaller than the proximate threshold value So, this embodiment determines that a human body is proximate to the antenna electrode and then outputs an ON output.

A variation of the detection value Vm caused by an environmental variation progresses very slowly compared to a variation of the detection value Vm caused by an approximation of a human body. Therefore, if the lower limit change threshold value SL is set sufficiently larger than the proximate threshold value So, a variation of the detection value Vm due to an environmental variation can be compensated by adjusting the frequency of the operation signal before wrongly detecting an approximation of a human body.

It is noted that while this embodiment is configured to send the operation signal every 10 msec for inputing to the antenna electrode 2 so as to obtain the detection values Vm, the cycle of outputting the operation signal can be set arbitrarily at any value. While this embodiment determines an approximation of a human body by comparing latest three detection values Vm which are obtained every 10 msec with the proximate threshold valu So, method for determination is not limited to this way. For instance, in a case that last detection value Vm is equal to or less than the proximate threshold value So, an approximation of a human body may be determined by outputting a plurality of operation signals in a row in a shorter cycle (for instance, 1 msec) than the normal cycle (10 msec) to compar a plurality of the detection values Vm obtained thereby with the proximate threshold value So. In this way, the detection sensitivity to a human body can be improved.

REFERENCE NUMERALS 1 touch sensor
2 antenna electrode
3 microcomputer (oscillator, determination means and adjustment means)
4 comparator (detection circuit)
5 integration circuit (detection circuit)

What is claimed is:

1. A touch sensor comprising
an oscillator which outputs a periodical operation signal;
an antenna electrode which has an electrostatic capacitance and varies a waveform of the operation signal due to an approximation of a human body to form an output voltage;
an output voltage line which is connected between the oscillator and the antenna electrode to transmit the operation signal from the oscillator to the antenna electrode and transmits the output voltage from the antenna electrode;
a source signal line which is connected to a source voltage and transmits a predetermined reference voltage;
a detection circuit which (i) compares the output voltage inputted from the output voltage line with the reference voltage inputted from the source signal line and (ii) when the output voltage is greater than the reference voltage, outputs a predetermined voltage, and integrates the predetermined voltage for a predetermined time and outputs the integrated voltage as a detection value;
a determination means which determines that a human body is proximate to the antenna electrode when the detection value is continuously smaller than a proximate threshold value for longer than a predetermined determination duration; and
an adjustment means which changes a frequency of the operation signal so that the detection value gets closer to a predetermined standard value when the detection value is continuously smaller than a change threshold for longer than a predetermined change duration,
wherein the change duration is longer than the determination duration.

2. The touch sensor according to claim 1, wherein
the change threshold value is closer to the standard value than the proximate threshold value.

3. The touch sensor according to claim 1, wherein
the detection circuit includes a comparator outputting ON or OFF output depending on a magnitude relation between the output voltage of the antenna electrode and the reference voltage, and an integration circuit integrating the output of the comparator.

4. The touch sensor according to claim 2, wherein
the detection circuit includes a comparator outputting ON or OFF output depending on a magnitude relation between the output voltage of the antenna electrode and the reference voltage, and an integration circuit integrating the output of the comparator.

* * * * *